United States Patent
Gaynor

(10) Patent No.: US 10,491,165 B2
(45) Date of Patent: Nov. 26, 2019

(54) DOHERTY AMPLIFIER WITH ADJUSTABLE ALPHA FACTOR

(71) Applicant: pSemi Corporation, San Diego, CA (US)

(72) Inventor: Michael P. Gaynor, Crystal Lake, IL (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/918,978

(22) Filed: Mar. 12, 2018

(65) Prior Publication Data

US 2019/0280651 A1 Sep. 12, 2019

(51) Int. Cl.
 *H03F 3/68* (2006.01)
 *H03F 1/02* (2006.01)
 *H03F 3/21* (2006.01)

(52) U.S. Cl.
 CPC .......... *H03F 1/0288* (2013.01); *H03F 3/211* (2013.01); *H03F 2200/546* (2013.01)

(58) Field of Classification Search
 CPC ............................... H03F 1/0288; H03F 3/68
 USPC ............................................. 330/124 R, 295
 See application file for complete search history.

(56) References Cited

U.S. PATENT DOCUMENTS

| | | |
|---|---|---|
| 2,210,028 A | 8/1940 | Doherty |
| 3,323,080 A | 5/1967 | Schwelb et al. |
| 3,882,431 A | 5/1975 | Hopwood et al. |
| 4,558,291 A | 12/1985 | Nichols |

(Continued)

FOREIGN PATENT DOCUMENTS

| | | |
|---|---|---|
| EP | 1887686 | 7/2007 |
| EP | 2426816 | 1/2010 |

(Continued)

OTHER PUBLICATIONS

Kim, et al. "Optimum Operation of Asymmetrical-Cells-Based Linear Doherty Power Amplifiers—Uneven Power Drive and Power Matching", IEEE Transactions on Microwave Theory and Techniques, vol. 53, No. 5, May 2005, pp. 1802-1809 (8 pgs).

(Continued)

*Primary Examiner* — Steven J Mottola
(74) *Attorney, Agent, or Firm* — Jaquez Land Greenhaus LLP; John Land, Esq.

(57) ABSTRACT

A Doherty amplifier circuit having a tunable impedance and phase ("TIP") circuit to provide an adjustable alpha factor, which allows for a selection of power added efficiency (PAE) curves that are useful for applications having different modulations or to meet other criteria. Embodiments include a Doherty amplifier having a TIP circuit that provides for tunability of the impedance $Z_{INV}$ (resulting in an adjustable alpha factor) while maintaining the phase of the output of the carrier amplifier at 90° (for a selected polarity)±a low phase variation. Embodiments of the TIP circuit include one or more series-connected TIP cells comprising at least one TIP circuit combined with a tunable phase adjustment circuit. In operation, when the impedance of a TIP cell is adjusted, adjustments within the cell are also made to provide a phase shift correction back towards 90° (at the selected polarity).

14 Claims, 9 Drawing Sheets

(56) References Cited

U.S. PATENT DOCUMENTS

| | | | |
|---|---|---|---|
| 4,792,805 | A | 12/1988 | Miglia |
| 5,019,793 | A | 5/1991 | McNab |
| 5,796,307 | A | 8/1998 | Kumagai et al. |
| 5,825,261 | A | 10/1998 | Goutelard |
| 6,016,304 | A | 1/2000 | Kyle et al. |
| 7,248,108 | B2 | 7/2007 | Fratti |
| 7,268,617 | B2 | 9/2007 | Kijima |
| 7,339,426 | B2 | 3/2008 | Gurvich et al. |
| 7,427,895 | B1 | 9/2008 | Okubo et al. |
| 7,440,733 | B2 | 10/2008 | Maslennikov et al. |
| 7,498,878 | B2 | 3/2009 | Lim |
| 7,541,868 | B2 | 6/2009 | Bingham |
| 8,022,760 | B2 | 9/2011 | Gajadharsing et al. |
| 8,314,654 | B2* | 11/2012 | Outaleb .............. H03F 1/0288 330/124 R |
| 8,710,924 | B2 | 4/2014 | van der Zanden et al. |
| 8,724,739 | B2 | 5/2014 | Morton et al. |
| 8,736,375 | B2 | 5/2014 | Murao |
| 9,634,615 | B1* | 4/2017 | Ahmed ............... H03F 1/0288 |
| 2009/0085667 | A1 | 4/2009 | Krvavac |
| 2010/0227599 | A1 | 9/2010 | Vella-Coleiro et al. |
| 2011/0193624 | A1* | 8/2011 | Scott ..................... H01P 5/04 330/124 R |
| 2011/0210786 | A1 | 9/2011 | Blednov |
| 2012/0146732 | A1 | 6/2012 | Murao |
| 2012/0294387 | A1 | 11/2012 | Ghannouchi et al. |

FOREIGN PATENT DOCUMENTS

| | | |
|---|---|---|
| JP | 2002124840 | 4/2002 |
| WO | 2006066461 | 6/2006 |

OTHER PUBLICATIONS

Anaren, "Design Considerations for Surace Mount Couplter, 2-Way Splitter for Doherty Power Amplifier", Applications Note, Jul. 25, 2014, 5 pgs.

Microwave Journal, "A Combined 360 Phase Shifter and Attenuator for Feedforward Amplifiers and Predistorters", Sep. 1, 1999, 3 pgs.

Andricos, et al., "Compact Ku-Bank T/R Module for High-Resolution Radar Imaging of Cold Land Processes", Physical Science, Mar. 1, 2010, 4 pgs.

Ferwalt, Darren W., "A Base Control Doherty Power Amplifier Design for Improved Efficiency in GSM Handsets", These submitted to Oregon State University, Dec. 10, 2003, 86 pgs.

MPT, "MPT 1820APS Attenuator-Phase Shifter", Jul. 25, 2014, 1 pg.

Gutierrez, Ray, "High-Efficiency Linearized LDMOS Amplifiers Utilize the RFAL Architecture", High Frequency Electronics, 2006, 5 pgs.

Zhao, Yu, "High Efficiency and High Linearity Doherty Amplifiers for Portable Wireless Communications", U.C. San Diego Electronic Theses and Dissertations, 2006, 191 pgs.

Jansen, Roelof, "The Evaluation of Doherty Amplifier Implementations", Department of Electrical and Electronic Engineering, University of Stellenbosch, Mar. 2008, 123 pgs.

Lee, et al., "Linearity Improvement of Doherty Amplifier with Analog Predistorter for WCDMA Applications", Proceedings of the 36th European Microwave Conference, Sep. 2006, Manchester UK, pp. 1205-1208 (4 pgs).

Agilent Technologies, "Linearization Design Guide", Sep. 2002, 50 pgs.

Ilic, et al., "Linearization of Doherty Amplifier with Second Harmonics and Fourth-Order Nonlinear Signals", International Journal of Communications, Issue 4, vol. 5, 2011, pp. 165-174 (10 pgs).

Shopov, Stefan, "MMIC Based Doherty Amplifiers for High-Frequency Wireless Communications", Thesis, Ottawa-Carleton Institute for Electrical and Computer Engineering, 2011, 127 pgs.

Chatzimisios, et al., Mobile Lightweight Wireless Systems: Second International ICST Conference, Nov. 30, 2010, p. 26.

Electronic Design "Monolithic RF Chip Optimises Doherty Amplifier Performance", Jul. 15, 2014, pp. 3 pgs.

Micro Precision Technologies, Inc., Microwave Journal, "A Combined 360 Phase Shifter and Attenuator for Feedforward Amplifiers and Perdistorters", Sep. 1999, 3 pgs.

Menon, Abilash, "Power Amplifier Linearization Implementation using Filed Programmable Gate Array", Masters Theses 1896, Feb. 2014, University of Massachusetts—Amherst, 129 pgs.

Park, et al., "A Predistortion Linearizer using Envelope-Feedback Technique with Simplifier Carrier Cancellation Scheme for Class-A and Class-AB Power Amplifiers", IEEE Transactions on Microwave Theory and Techniques, vol. 48, No. 6, Jun. 2000, pp. 898-904 (7 pgs.).

Stone, Ross, "Review of Radio Science 1999-2002", 2002, p. 9.

Oh, et al., "The Verification of Linearizer for Wibro PAM", Computational Science and Its Applications—ICCSA 2006, Lecture Notes in Computer Science, vol. 3981, 2006, 1 pg.

Draxler, et al., "A Multi-Band CMOS Doherty PA with Tunable Matching Network", Qualcomm Technologies, IEEE 2017, 3 pgs.

* cited by examiner

*700*

> Providing a Doherty amplifier having an impedance inverter comprising a tunable impedance and phase circuit providing tunability of the characteristic impedance of the impedance inverter while maintaining the insertion phase of a signal through the impedance inverter at approximately 90° with a selected polarity — 702

> Providing a Doherty amplifier with circuitry for providing a tunable alpha factor — 802

Providing a Doherty amplifier having an impedance inverter comprising at least one digitally tunable circuit configured to provide tunability of (1) the characteristic impedance of the Doherty amplifier, and (2) the phase of a signal input to the impedance inverter to maintain the phase of the signal at approximately 90° with a selected polarity ── 902

FIG. 9

DOHERTY AMPLIFIER WITH ADJUSTABLE ALPHA FACTOR

BACKGROUND

(1) Technical Field

This invention relates to electronic circuits, and more particularly to radio frequency amplifier circuits.

(2) Background

Many modern electronic systems include radio frequency (RF) transceivers; examples include personal computers, tablet computers, wireless network components, televisions, cable system "set top" boxes, radar systems, and cellular telephones. Many RF transceivers are quite complex two-way radios that transmit and receive RF signals across multiple frequencies in multiple bands using one or more signaling protocols. As an example, a modern "smart telephone" may include RF transceiver circuitry capable of operating on different cellular communications systems (e.g., GSM and CDMA), on different wireless network frequencies and protocols (e.g., IEEE 802.1bg at 2.4 GHz, and IEEE 802.1n at 2.4 GHz and 5 GHz), and on "personal" area networks (e.g., Bluetooth based systems).

In portable battery-operated devices, such as cellular telephones, RF power amplifiers (PAs) in RF transceivers consume a significant part of the total device current, thus impacting battery life. Accordingly, reducing the average PA current will extend battery life and prolong "talk time", defined as the time it takes to discharge the device battery while on a telephone call or transmitting or receiving data.

Cellular phone systems require a handset PA to output a range of power levels, depending on distance to a base station and signal path conditions. The efficiency of such systems can be expressed by a percentage: power added efficiency (PAE), defined as (RF power out−RF power in)÷DC power supplied; higher percentages are desirable. Efforts have been made to maximize PAE at full power level, and in some systems (e.g., GSM cellular systems), PAE has reached 50-60% at full power. It has been suggested that improving PAE at lower power levels would be beneficial as well, thus increasing average PAE across power levels; see, for example, Darren W. Ferwalt, "*A Base Control Doherty Power Amplifier Design for Improved Efficiency in GSM Handsets*", § 1.1 and § 1.2, Masters of Science Thesis at Oregon State University, Dec. 10, 2003.

One method to achieve improved PAE at lower power levels was originally developed by William Doherty, as described in U.S. Pat. No. 2,210,028, issued Aug. 6, 1940. FIG. 1A is a simplified schematic diagram of a prior art Doherty amplifier 100. A Doherty amplifier 100 is composed of a carrier amplifier 102 coupled in parallel with a peaking amplifier 104; the amplifiers 102, 104 may be, for example, MOSFET-based circuits. An RF input signal, $RF_{IN}$, is applied directly to the carrier amplifier 102 with no phase shift, and indirectly to the peaking amplifier 104 through a quarter wave transmission line L1 that shifts the phase of $RF_{IN}$ by −90°. The output of the carrier amplifier 102 is phase shifted by −90° by a quarter wave transmission line L2 and combined in phase with the output of the peaking amplifier 104 to provide an amplified RF output signal, $RF_{OUT}$, at a load resistance, $R_L$. The quarter wave transmission line L2 is also known as an impedance inverter and has a characteristic impedance ($Z_0$) of $Z_{INV}$.

In operation, both amplifiers 102, 104 are ON at full power, while at low power levels the peaking amplifier 104 is OFF. The two amplifiers 102, 104 are configured such that as the power out of the peaking amplifier 104 is reduced, the load impedance of the carrier amplifier 102 is increased, allowing the carrier amplifier 102 to operate at higher efficiency at a lower power levels. The combined efficiency at reduced power is therefore improved over that of a single amplifier.

A problem of conventional Doherty amplifiers 100 is that, while their output may be applied to a tunable impedance matching network to provide impedance matching for different RF bands, they have a constant alpha factor, $\alpha=R_L/Z_{INV}$. For example, FIG. 1B is a graph 150 of amplifier efficiency as a function of output power, Pout, for a prior art Doherty amplifier having a constant alpha factor of 0.25 (graph curve 152), and for a prior art Doherty amplifier having a constant alpha factor of 0.5 (graph curve 154); a dashed graph curve 156 shows the characteristics for an ideal class B amplifier. For some applications, an alpha factor of 0.25 may be preferred, while for other applications, an alpha factor of 0.5 may be preferred (of course, other alpha factors can be used).

A constant $\alpha$ is not beneficial across different modulation schemes, such as the modulation schemes used in cellular telephone systems (e.g., Long Term Evolution (LTE), 5G NR, WDCMA, CDMA, GSM, etc.), WiFi LANS, and other wireless transmission systems, particularly those using battery-powered transceivers. These modulation schemes have different peak to average ratios of power. The amplifier must be able to handle the peak power but is more frequently operated at the lower average power. These peak to average ratios currently range from 0 dB to about 7 dB. A single fixed Doherty amplifier employed for all these modulation schemes will suffer from poorer PAE at the high peak to average ratios.

Accordingly, there is a need for a Doherty amplifier circuit having an adjustable alpha factor. The present invention meets this need.

SUMMARY

Embodiments of the present invention encompass a Doherty amplifier circuit having a tunable impedance and phase circuit to provide an adjustable alpha factor. The adjustable alpha factor allows for a selection of power added efficiency (PAE) curves that are useful for applications having different modulation schemes or to meet other criteria. In particular, an adjustable alpha factor allows the secondary PAE peak to be adjusted so that the overall PAE can be optimized for different modulations (peak-to-average ratio) and also for average power level. Embodiments maintain good PAE over a wide range of power levels.

Embodiments include a Doherty amplifier in which the conventional distributed quarter wave transmission line impedance inverter is replaced by a tunable impedance and phase ("TIP") circuit. The characteristics of the TIP circuit are that it provides for tunability of the impedance $Z_{INV}$ (thus resulting in an adjustable $\alpha=R_L/Z_{INV}$) while maintaining the phase of the output of the carrier amplifier at 90° (for a selected polarity)±an acceptably low phase variation.

Various embodiments of the TIP circuit include one or more series-connected tunable and phase impedance cells comprising at least one tunable impedance circuit combined with at least one tunable phase adjustment circuit. In operation, when the impedance of a tunable impedance and phase cell is adjusted, adjustments within the cell are also made to provide a phase shift correction back towards 90° (at the selected polarity).

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 7 is a process flow chart showing a first method of making a Doherty amplifier.

FIG. 8 is a process flow chart showing a second method of making a Doherty amplifier.

FIG. 9 is a process flow chart showing a third method of making a Doherty amplifier.

Like reference numbers and designations in the various drawings indicate like elements.

DETAILED DESCRIPTION

Embodiments of the present invention encompass a Doherty amplifier circuit having a tunable impedance and phase circuit to provide an adjustable alpha factor. The adjustable alpha factor allows for a selection of power added efficiency (PAE) curves that are useful for applications having different modulation schemes or to meet other criteria. In particular, an adjustable alpha factor allows the secondary PAE peak to be adjusted so that the overall PAE can be optimized for different modulations (peak-to-average ratio) and also for average power level. Embodiments maintain good PAE over a wide range of power levels.

The transmission lines L1, L2 of a conventional Doherty amplifier can be approximated with lumped element circuits, and in some applications, the lumped element circuits may be tunable. However, simply replacing the conventional impedance inverter L2 with a tunable lumped element equivalent circuit, such as a tunable LC1ow pass filter, results in a circuit in which the alpha factor can be adjusted (by adjusting the L or C values to change $Z_{INV}$—and thus the characteristic impedance $Z_0$—for the lumped element circuit), but in which the phase of the output of the inverter L3 shifts substantially away from an optimal 90° value (for a selected polarity), thus altering the impedance transformation for the carrier amplifier 102, and also altering the phase alignment when the outputs of the amplifiers 102, 104 are combined. This will cause a loss in power due to combining the two signals out of phase.

Figure 1A:
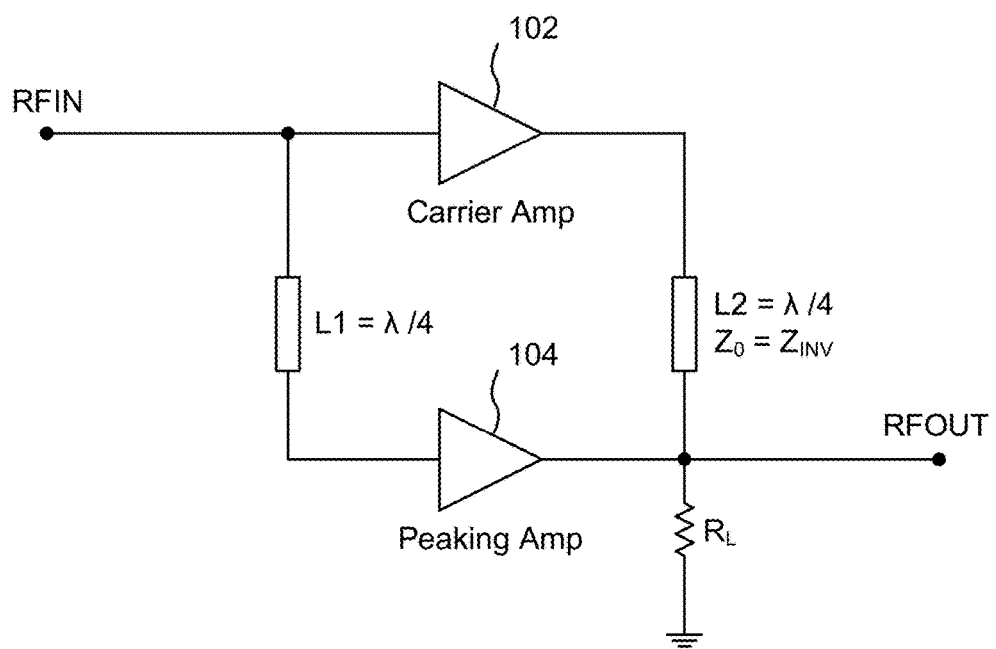
FIG. 1A is a simplified schematic diagram of a prior art Doherty amplifier.
Figure 1B:
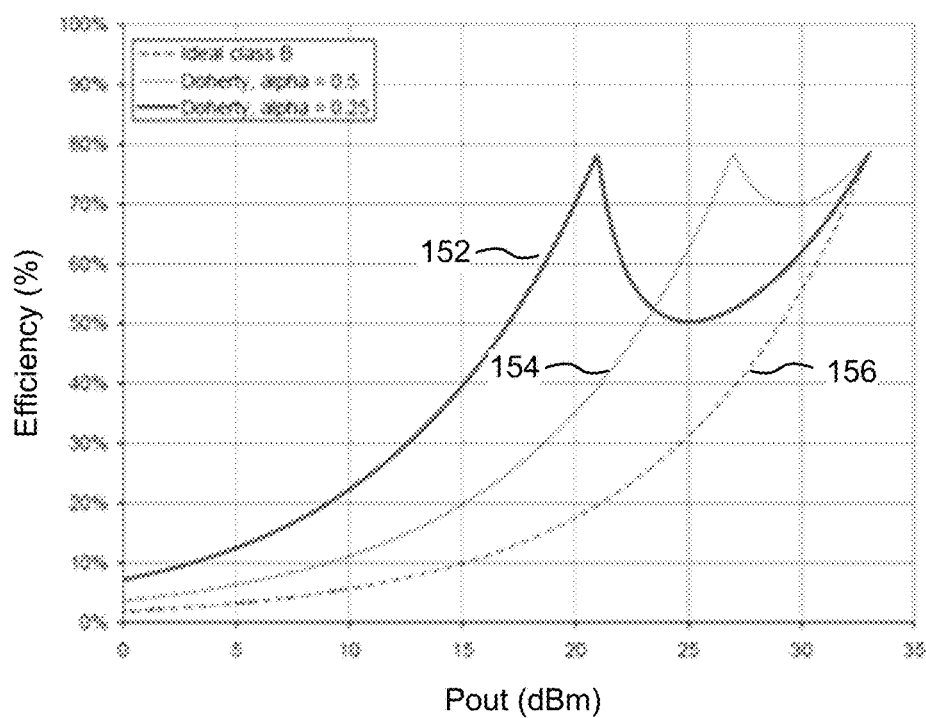
FIG. 1B is a graph of amplifier efficiency as a function of output power, Pout, for a prior art Doherty amplifier having a constant alpha factor of 0.25, and for a prior art Doherty amplifier having a constant alpha factor of 0.5; a dashed graph curve shows the characteristics for an ideal class B amplifier.
Figure 2:
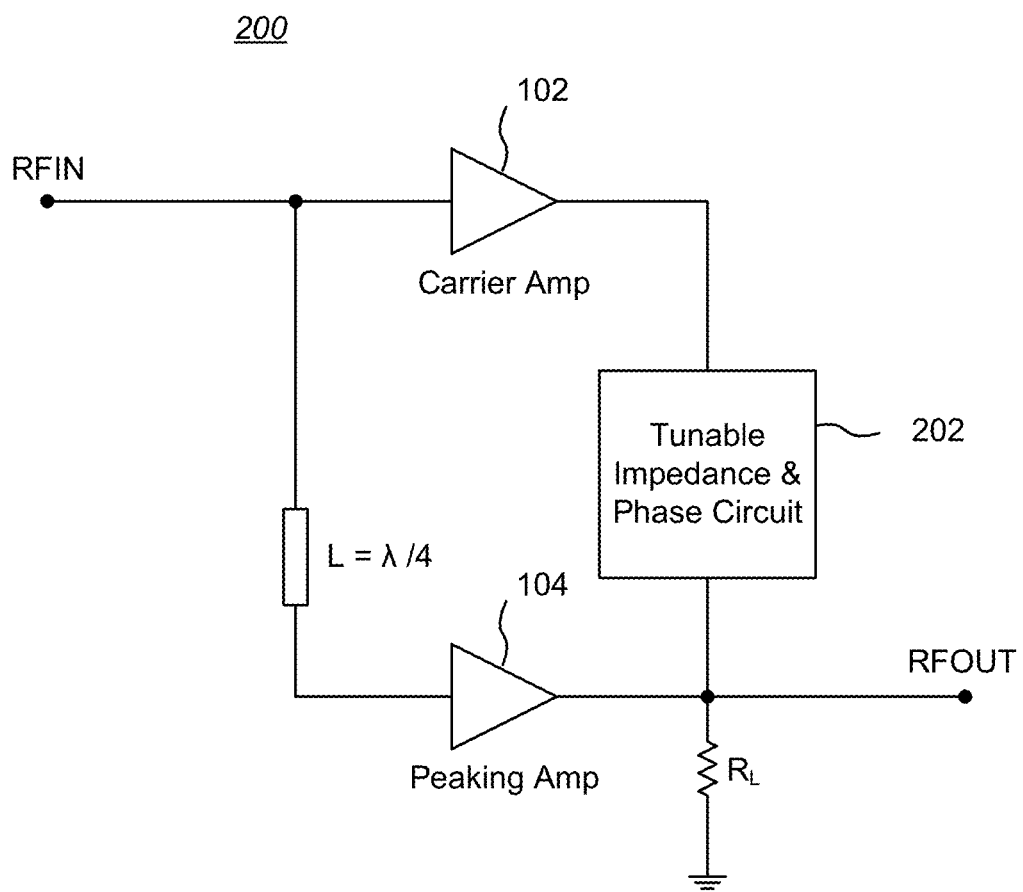
FIG. 2 is a simplified schematic diagram of a Doherty amplifier that provides an adjustable alpha factor with low phase shift.

FIG. 2 is a simplified schematic diagram of a Doherty amplifier 200 that provides an adjustable alpha factor with low phase shift. The amplifier circuit is similar to the circuit of FIG. 1A, except that the conventional distributed quarter wave transmission line impedance inverter L2 is replaced by a tunable impedance and phase ("TIP") circuit 202. The characteristics of the TIP circuit 202 are that it provides for tunability of the impedance $Z_{INV}$ (thus resulting in an adjustable $\alpha = R_L/Z_{INV}$) while maintaining the phase of the output of the carrier amplifier 102 at 90° (for a selected polarity, positive or negative)±an acceptably low phase variation; for many applications, the low phase variation would be about ±10°, but lower phase variation ranges are achievable, as described below.

Figure 3A:
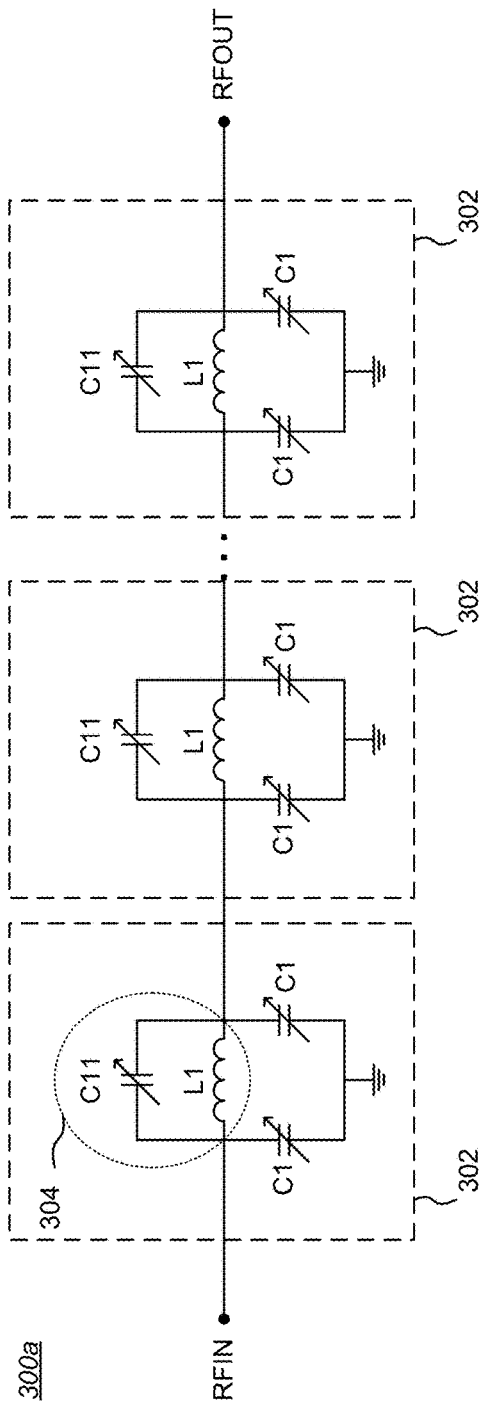
FIG. 3A is a schematic diagram of a first embodiment of a tunable impedance and phase circuit.

Various embodiments of the TIP circuit 202 include one or more stages of tunable circuits that provide a 90° phase shift (of a selected polarity) to the input signal and a tunable impedance. This may allow for tighter control of phase variation over frequency. For example, FIG. 3A is a schematic diagram of a first embodiment of a tunable impedance and phase circuit 300a. In the illustrated embodiment, an RF input signal (e.g., from the carrier amplifier 102) $RF_{IN}$ is coupled through one or more series-connected tunable impedance and phase ("TIP") cells 302 to $RF_{OUT}$. In this example, each TIP cell 302 includes a "pi" type CLC circuit comprising a series inductor L1 and two bracketing tunable shunt capacitors C1, which generally have the same range of values. In addition, a tunable capacitor C11 is coupled in parallel with the series inductor L1, thereby forming a tunable inductor circuit 304 (shown within the dotted oval).

More particularly, the TIP cell 302 in FIG. 3A may be viewed as a lumped element approximation of a transmission line. Multiple TIP cells 302 may be cascaded to increase the bandwidth of the lumped element transmission line; in general, each successive TIP cell 302 is a smaller step in phase. Making the lumped elements tunable allows tuning or adjustment of the characteristic impedance and the phase shift of the network. While either or both of tunable inductors and tunable capacitors may be used for such lumped elements, tunable inductors tend to consume significant integrated circuit area. However, a tunable inductor may be realized by placing a tunable capacitor (e.g., C11) in parallel with a fixed inductor (e.g., L1), as in the example tunable inductor circuit 304 of FIG. 3A.

In operation, the impedance and phase of a TIP cell 302 may be adjusted by changing the size and/or ratio of the tunable impedance and tunable capacitance lumped elements. In the specific example of the TIP cell 302 of FIG. 3A, tuning of both impedance and phase may be accomplished by tuning the capacitors C1 and C11. Accordingly, $Z_{INV}$ may be adjusted for a coupled carrier amplifier 102 as needed to achieve a selected a factor while making a phase shift correction back towards 90° (of the selected polarity) for proper amplifier function. Tuning of C1 and C11 may be a concurrent or an iterative process since each of C1 and C11 affect the impedance and the phase of the TIP cell 302. In practice, a calibration process may be performed that maps tuning states of C1 and C11 such that a desired impedance and phase shift can be achieved by concurrently adjusting C1 and C11 to specific values, without using an iterative process. Alternatively, such mapping may be done by design and/or simulation. The mapped values may be stored in a lookup table. Such a lookup table may include functions such as inputting a desired mode (e.g., a certain transmission configuration, such as for an LTE cell system), mapping that mode to desired component values for a desired a factor, and outputting the tuning values to adjust C1 and/or C11. Alternatively, the tuning states of C1 and C11 may be dynamically adjusted in a closed-loop manner by measuring the phase and impedance of the output of the TIP cell 302 and readjusting the tuning values of C1 and/or C11 as needed to achieve a desired impedance and phase shift.

Stated another way, each example TIP cell 302 in FIG. 3A can be regarded as two coupled circuits, one primarily for adjusting impedance and the other primarily for adjusting phase, but is better regarded as a single tunable circuit that can concurrently tune impedance and phase. Regardless of characterization, embodiments of the invention enable adjustment of the alpha factor, thus allowing the secondary PAE peak to be adjusted so that the overall PAE can be optimized for different modulations (peak-to-average ratio) and also for average power level.

Figure 3B:
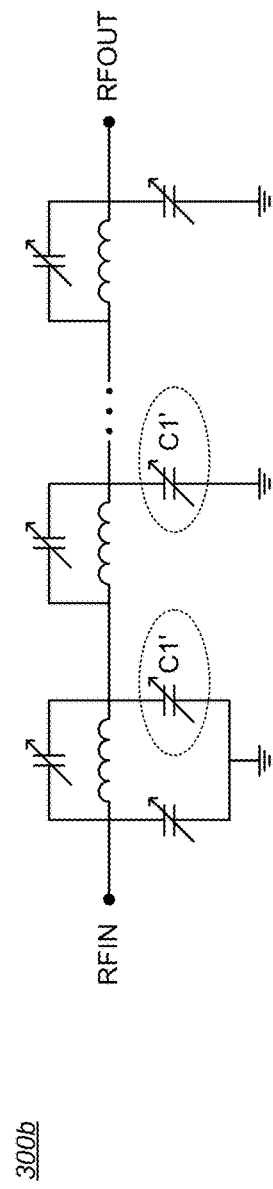
FIG. 3B is a schematic diagram of a second embodiment of a tunable impedance and phase circuit.

FIG. 3B is a schematic diagram of a second embodiment of a tunable impedance and phase circuit 300b. The illustrated circuit is essentially the same as the circuit of FIG. 3A (some reference labels have been omitted to avoid clutter), except that pairs of shunt capacitors C1 in FIG. 3A situated between the inductors L1 of adjacent TIP cells 302 are replaced by a single "shared" capacitor C1', thus saving components and integrated circuit die area. In general, the value of capacitor C1' should be about the sum of the pair of capacitances C1 that are replaced by capacitor C1' (thus, if the capacitors C1 of a replaced pair are of equal value, then capacitor C1' generally should be about twice the capacitance of a C1 capacitor).

Figure 4:
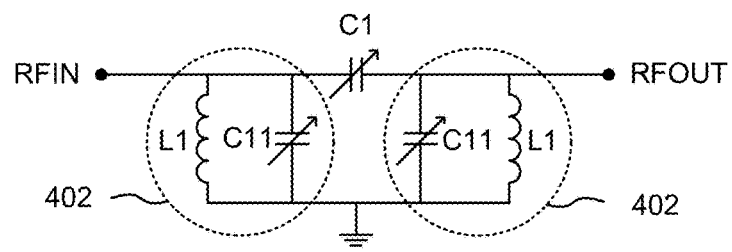
FIG. 4 is a schematic diagram of a third embodiment of a tunable impedance and phase circuit.

FIG. 4 is a schematic diagram of a third embodiment of a tunable impedance and phase circuit. In this example, a tunable impedance and phase ("TIP") cell 400 comprises a "pi" type LCL circuit including a series capacitor C1 and two bracketing shunt inductors L1. In addition, a pair of tunable capacitors C11, which generally have the same range of values, are coupled in parallel with the shunt inductors L1, thereby forming a tunable inductor circuit 402 (shown within the dotted ovals). Note that the illustrated TIP cell 400 functions as a high-pass network that would provide a +90° base phase shift, and accordingly needs an input that is shifted +90° to function properly (for example, see FIG. 5B below).

The TIP cell 400 is thus the "LCL" dual of the "CLC" TIP cell 302 of FIG. 3A, and is tunable in a similar manner. As described above, tuning of C1 and C11 may be a concurrent or an iterative process, since each of C1 and C11 affect the impedance and the phase of the TIP cell 302. Similarly, calibration, mapping, and/or closed-loop adjustment processes may be applied, as described above for the TIP cell 302 of FIG. 3A.

Note that the polarity of phase shift of particular subcircuits may be varied in other embodiments. The key is that the phase shifts line up so that the outputs of the carrier amplifier 102 and the peaking amplifier 104 combine in phase. For example, some embodiments may use a −90° phase shift in front of the carrier amplifier 102, or a −90° phase shift in front of the peaking amp (as described above with respect to FIG. 1A), so long as the outputs of the amplifiers 102, 104 are properly shifted to combine in phase. Transmission lines may also be used to create the various phase shifts required.

Figure 5A:
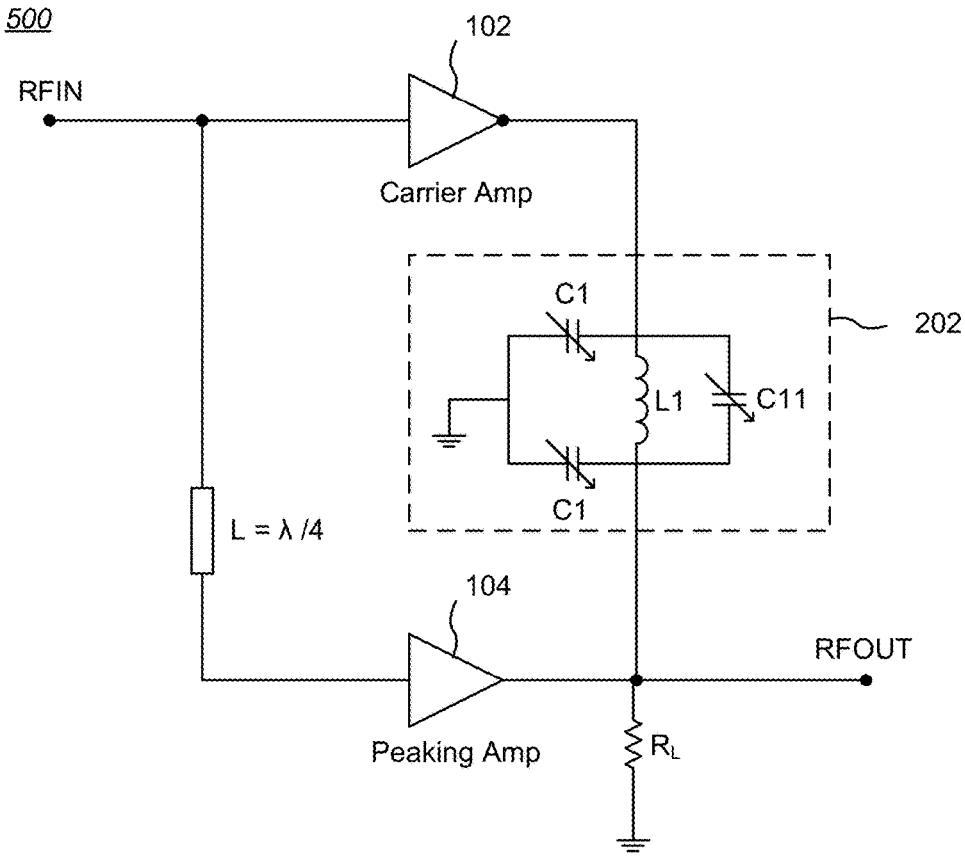
FIG. 5A is a schematic diagram of the Doherty amplifier of FIG. 2 in which the block symbol representing the tunable impedance and phase circuit has been replaced by one tunable impedance and phase cell of the type shown in FIG. 3A.

For complete context, FIG. 5A is a schematic diagram 500 of the Doherty amplifier of FIG. 2 in which the block symbol representing the tunable impedance and phase circuit 202 has been replaced by one tunable impedance and phase cell 302 of the type shown in FIG. 3A.

Figure 5B:
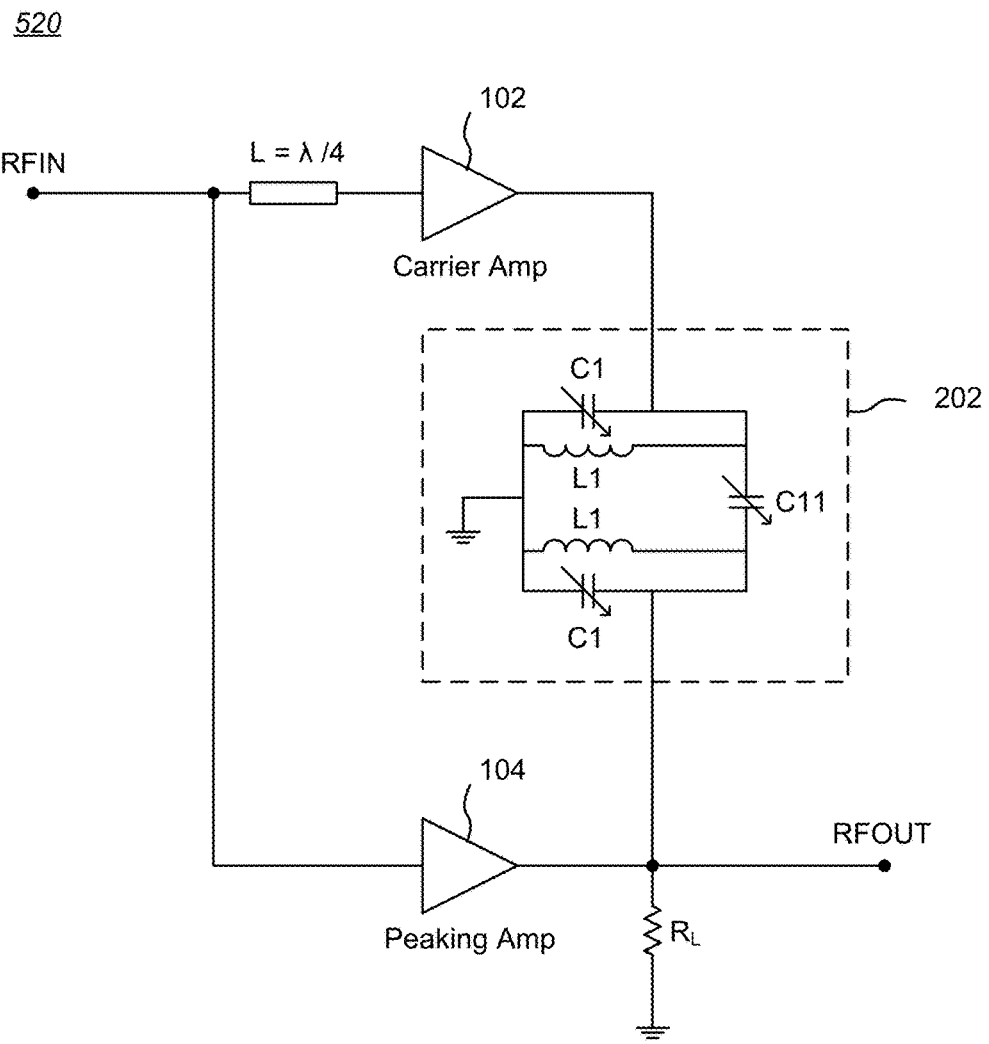
FIG. 5B is a schematic diagram of a modified version of the Doherty amplifier of FIG. 2 in which the block symbol representing the tunable impedance and phase circuit has been replaced by one tunable impedance and phase cell of the type shown in FIG. 4.

Similarly, FIG. 5B is a schematic diagram 520 of a modified version of the Doherty amplifier of FIG. 2 in which the block symbol representing the tunable impedance and phase circuit 202 has been replaced by one tunable impedance and phase cell 400 of the type shown in FIG. 4. In this example, the input to the carrier amplifier 102 is shifted by −90° phase with respect to the direct input to the peaking amplifier 104, since the TIP cell 400 is a high-pass network.

As one of ordinary skill in the art would recognize, there are numerous other ways of implementing a tunable impedance and phase circuit that provides for tunability of the impedance $Z_{INV}$ (thus resulting in an adjustable α) while maintaining the phase of the output of the carrier amplifier 102 at 90° (of a selected polarity)±an acceptably low phase variation. For example, embodiments of the invention may be implemented using tee-type (also known as "T-type") tuning networks that are the duals of the "CLC" or "LCL" pi-type tuning networks of FIGS. 3A and 4, respectively. As additional examples, embodiments of the invention may be implemented using other types of tuning networks, including (but not limited to) LC, CL, low-pass, high-pass, etc., circuits in various topological configurations, such as pi, tee, bridged-T, L-pad, etc.

The tunable capacitors C1 and C11 need not have the same range of values, and the range of values may vary among the TIP cells 302. One or more of the tunable capacitors C1, C11 may comprise, for example, a digitally tunable capacitor (DTC) of the type described in U.S. Pat. No. 9,024,700, issued on May 5, 2015, entitled "Method and Apparatus for use in Digitally Tuning a Capacitor in an Integrated Circuit Device" or in U.S. Pat. No. 9,197,194, issued on Nov. 24, 2015, entitled "Method and Apparatus for Use in Tuning Reactance in a Circuit Device", the contents of both of which are hereby incorporated by reference. The inductor L1 may be fixed (as shown in FIGS. 3A, 3B, and 4), or may be variable, such as a digitally tunable inductor (DTL) of the type described in U.S. Pat. No. 9,197,194.

While it is beneficial to fabricate all of the components of a TIP cell 302 on an integrated circuit (IC) die, some components may be off-die. For example, in the examples shown in FIGS. 3A, 3B, and 4, it may be useful to use off-die inductors for L1 since IC inductors often consume significant die area.

Series connecting multiple TIP cells 302, as in FIG. 3A, better approximates the characteristics of a transmission line, increases the bandwidth of the circuit, and improves the tolerance of the phase shift capability (some modeled examples of the circuit of FIG. 3A can maintain the phase of the output of the carrier amplifier 102 at 90°±~5° or better for a selected polarity). However, in some embodiments, it may be useful to connect multiple TIP cells 302 in parallel, or in a configuration with some TIP cells 302 connected in parallel and some TIP cells 302 connected in series (e.g., a parallel-series configuration or a mesh configuration).

Specific Example

In one modeled example of a TIP cell 302 of the type shown in FIG. 3A, capacitors C1, C11 were implemented with DTCs, with the DTCs for the C1 capacitors having the same range and settings; a fixed value (13.9 nH) inductor L1 was used for the model. By setting the DTC's to the values shown in TABLE 1 below, the characteristic impedance $Z_0$ (=$Z_{INV}$) of the TIP cell 302 can be varied over a range of about 70Ω to about 190Ω while maintaining a −90°±10° phase shift over a frequency range of 825-925 MHz.

TABLE 1

| C11 (pF) | C1 (pF) | L1 (nH) | $Z_0$ |
|---|---|---|---|
| 0.10 | 2.03 | 13.9 | 70 |
| 0.68 | 1.61 | 13.9 | 100 |
| 0.89 | 1.5 | 13.9 | 130 |
| 1.21 | 1.09 | 13.9 | 160 |
| 1.36 | 0.96 | 13.9 | 190 |

Note that with these example circuit values, a ~14× tuning ratio for C11 is required to fully cover a $Z_0$ range of about 70Ω to about 190Ω, but only a 2× tuning ratio for C11 is required to cover a $Z_0$ range of about 100Ω to about 190Ω.

Figure 6:
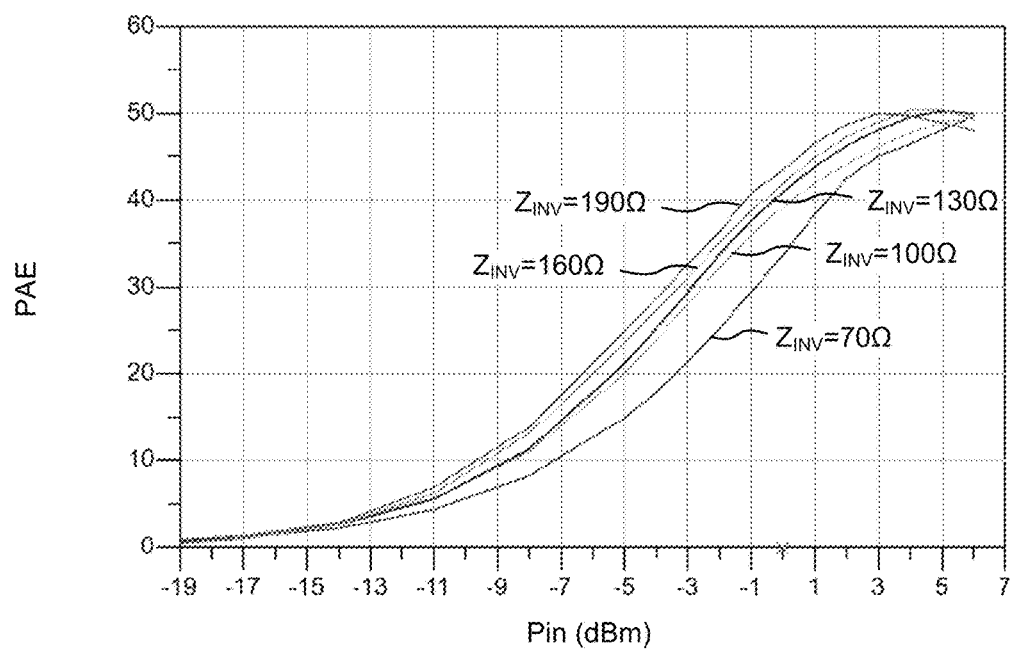
FIG. 6 is a graph showing PAE as a function of power input (Pin) for different values of $Z_{INV}$ for a modeled tunable impedance and phase cell of the type shown in FIG. 3A, using the values shown in TABLE 1.

FIG. 6 is a graph showing PAE as a function of power input (Pin) for different values of $Z_{INV}$ (i.e., expressed as "x Ω") for a modeled TIP cell 302 of the type shown in FIG. 3A, using the values shown in TABLE 1. As can be seen, for particular levels of input power, the PAE curves can be varied by adjusting the characteristic impedance $Z_0$ (=$Z_{INV}$) of the TIP cell 302, thereby adjusting a (=$R_L/Z_{INV}$).

Calibration

A TIP circuit 202 may be calibrated to obtain a set of component values similar to those shown in TABLE 1, with the same, more, or fewer distinct $Z_0$ settings. One calibration method is to step through the possible combinations of values for DTCs comprising capacitors C1 and C11, and measure the resulting characteristic impedance $Z_0$ for the circuit. If each DTC has 5 control bits, meaning that $2^5$=32 states per DTC can be selected, the number of combinations of values for C1 and C11 in a single TIP cell 302 of the type shown in FIG. 3A is 1024 ($2^5 \times 2^5$, assuming that both C1 capacitors are set to the same value for each combination). Using multiple TIP cells 302 increases the total number of available combinations.

It may be convenient to select a subset of such DTC combinations that result in $Z_0$ values that closely match desired characteristic impedances. In any case, the combinations of settings for the DTCs may be stored in a look-up table that maps DTC state to specific $Z_0$ values. The look-up table may be implemented as a read-only memory device (e.g., ROM, PROM, EAROM, EPROM, etc.) which may be used in conjunction with conventional control circuitry.

Methods

Another aspect of the invention includes methods for making a Doherty amplifier having a tunable impedance and phase circuit that provides an adjustable alpha factor. For example, FIG. 7 is a process flow chart showing a first method of making a Doherty amplifier, including providing a Doherty amplifier having an impedance inverter comprising a tunable impedance and phase circuit providing tunability of the characteristic impedance of the impedance inverter while maintaining the insertion phase of a signal through the impedance inverter at approximately 90° with a selected polarity (e.g., −90° or)+90° (STEP 702).

As another example, FIG. 8 is a process flow chart showing a second method of making a Doherty amplifier, including providing the Doherty amplifier with circuitry for providing a tunable alpha factor (STEP 802).

As yet another example, FIG. 9 is a process flow chart showing a third method of making a Doherty amplifier, including providing a Doherty amplifier having an impedance inverter comprising at least one digitally tunable circuit configured to provide tunability of (1) the characteristic impedance of the Doherty amplifier, and (2) the phase of a signal input to the impedance inverter to maintain the phase of the signal at approximately 90° with a selected polarity.

Other embodiments of the above methods may include one or more of the following aspects: wherein the phase of the signal through the impedance inverter is maintained at 90°±about 10° with a selected polarity; wherein the phase of the signal through the impedance inverter is maintained at 90°±about 5° with a selected polarity; wherein the tunable impedance and phase circuit includes one or more series-connected and/or parallel-connected tunable impedance and phase cells; wherein the at least one tunable impedance and phase cell utilizes at least one digitally tunable capacitor to provide tunability; wherein the at least one tunable impedance and phase circuit comprises one of an LCL circuit or a CLC circuit or an LC circuit or a CL circuit; wherein the tunable impedance and phase circuit is configured in one of a pi-type or tee-type configuration; wherein the circuitry for providing a tunable alpha factor provides tunability of the characteristic impedance of the Doherty amplifier; wherein the circuitry for providing a tunable alpha factor provides tunability of the phase of a signal input to maintain the phase of the signal at approximately 90° with a selected polarity; wherein the circuitry for providing a tunable alpha factor includes at least one tunable circuit comprising one of an LCL circuit or a CLC circuit or an LC circuit or a CL circuit; wherein the circuitry for providing a tunable alpha factor includes at least one tunable circuit configured in one of a pi-type or tee-type configuration; wherein the phase of the signal is maintained at 90°±about 10° with a selected polarity; wherein the phase of the signal is maintained at 90°±about 5° with a selected polarity; further including adjusting the tunable alpha factor for different modulations of an input signal; and further including adjusting the tunable alpha factor for different power levels of an input signal.

Uses

Circuits and devices in accordance with the present invention may be used alone or in combination with other components, circuits, and devices. Embodiments of the present invention may be fabricated as integrated circuits (ICs), which may be encased in IC packages and/or or modules for ease of handling, manufacture, and/or improved performance.

Circuits in accordance with the present invention are useful in a wide variety of larger radio frequency (RF) circuits for performing a range of functions. Such functions are useful in a variety of applications, such as radar systems (including phased array and automotive radar systems), radio systems, and test equipment. Such circuits may be useful in systems operating over some or all of the RF range (e.g., from around 20 kHz to about 300 GHz).

Radio system usage includes cellular radios systems (including base stations, relay stations, and hand-held transceivers) that use such technology standards as various types of orthogonal frequency-division multiplexing ("ODFM"), various types of quadrature amplitude modulation ("QAM"), Code Division Multiple Access ("CDMA"), Wide Band Code Division Multiple Access ("WCDMA"), Global System for Mobile Communications ("GSM"), Enhanced Data Rates for GSM Evolution (EDGE), Long Term Evolution ("LTE"), 5G New Radio ("5G NR"), as well as other radio communication standards and protocols.

In particular, the present invention is useful in portable battery-operated devices, such as cellular telephones, that would benefit from utilizing a Doherty amplifier circuit having a tunable impedance and phase circuit that provides an adjustable alpha factor. The adjustable alpha factor allows for a selection of PAE curves over a wide range of power levels, thereby allowing greater control of current consumption in such devices, and thus enabling better battery life.

Fabrication Technologies & Options

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A Doherty amplifier including an impedance inverter comprising a lumped-element digitally tunable impedance and phase circuit providing tunability of both an impedance state of the impedance inverter and a phase shift state of the impedance inverter so as to maintain, over a range of impedances, the insertion phase of a signal through the impedance inverter at approximately 90° with a selected polarity.

2. The invention of claim 1, wherein the phase of the signal through the impedance inverter is maintained at 90°±about 10° with the selected polarity.

3. The invention of claim 1, wherein the phase of the signal through the impedance inverter is maintained at 90°±about 5° with the selected polarity.

4. The invention of claim 1, wherein the lumped-element digitally tunable impedance and phase circuit includes one or more series-connected and/or two or more parallel-connected tunable impedance and phase cells.

5. The invention of claim 4, wherein the at least one tunable impedance and phase cell utilizes at least one digitally tunable capacitor to provide tunability.

6. The invention of claim 4, wherein the at least one lumped-element digitally tunable impedance and phase circuit comprises one of an LCL circuit or a CLC circuit or an LC circuit or a CL circuit.

7. The invention of claim 1, wherein the lumped-element digitally tunable impedance and phase circuit is configured in one of a pi-type or tee-type configuration.

8. The invention of claim 1, wherein the lumped-element digitally tunable impedance and phase circuit provides a tunable alpha factor for the A-Doherty amplifier.

9. The invention of claim 1, wherein a plurality of impedance states are mapped to a corresponding plurality of phase shift states, and the mapped states are stored in a lookup table configured to tune both the impedance state of the impedance inverter and the phase shift state of the impedance inverter so as to maintain, over a range of impedances, the insertion phase of a signal through the impedance inverter at approximately 90° with a selected polarity.

10. The invention of claim 8, wherein the tunable alpha factor is adjusted for different modulations of an input signal.

11. The invention of claim 8, wherein the tunable alpha factor is adjusted for different power levels of an input signal.

12. A Doherty amplifier including an impedance inverter including at least one lumped-element digitally tunable circuit configured to provide concurrent tunability of both the characteristic impedance of the impedance inverter and the phase of a signal input to the impedance inverter so as to maintain, over a range of impedances, the phase of the signal at approximately 90° with a selected polarity.

13. The invention of claim 12, wherein the phase of the signal is maintained at 90°±about 10° with the selected polarity.

14. The invention of claim 12, wherein the phase of the signal is maintained at 90°±about 5° with the selected polarity.

* * * * *